United States Patent [19]

Bunch

[11] Patent Number: 4,570,231
[45] Date of Patent: Feb. 11, 1986

[54] FAULT FINDER

[75] Inventor: Richard H. Bunch, 1614 NW. 106th St., Vancouver, Wash. 98665

[73] Assignee: Richard H. Bunch, Vancouver, Wash.

[21] Appl. No.: 574,510

[22] Filed: Jan. 27, 1984

[51] Int. Cl.[4] ...................... G01R 31/08; G06F 15/20
[52] U.S. Cl. .................................. 364/492; 364/481; 324/52; 361/80
[58] Field of Search ...................... 364/492, 481, 572; 324/52, 51; 361/80, 81, 79

[56] References Cited

U.S. PATENT DOCUMENTS

| 4,107,778 | 8/1978 | Nii et al. | 364/492 |
|---|---|---|---|
| 4,313,169 | 1/1982 | Takagi et al. | 364/492 |
| 4,466,071 | 8/1984 | Russell, Jr. | 364/492 |

OTHER PUBLICATIONS

Automatic Fault Locator for Bonneville Power Administration; Marihart et al, IEEE Conference Paper C 72 513-0, 1972.
Fault Location Methods for Overhead Lines; Marihart et al, IEEE Conference Paper 57-160, 1956.

Primary Examiner—Edward J. Wise
Attorney, Agent, or Firm—Robert Southworth, III; Judson R. Hightower

[57] ABSTRACT

A fault finder for locating faults along a high voltage electrical transmission line. Real time monitoring of background noise and improved filtering of input signals is used to identify the occurrence of a fault. A fault is detected at both a master and remote unit spaced along the line. A master clock synchronizes operation of a similar clock at the remote unit. Both units include modulator and demodulator circuits for transmission of clock signals and data. All data is received at the master unit for processing to determine an accurate fault distance calculation.

7 Claims, 20 Drawing Figures

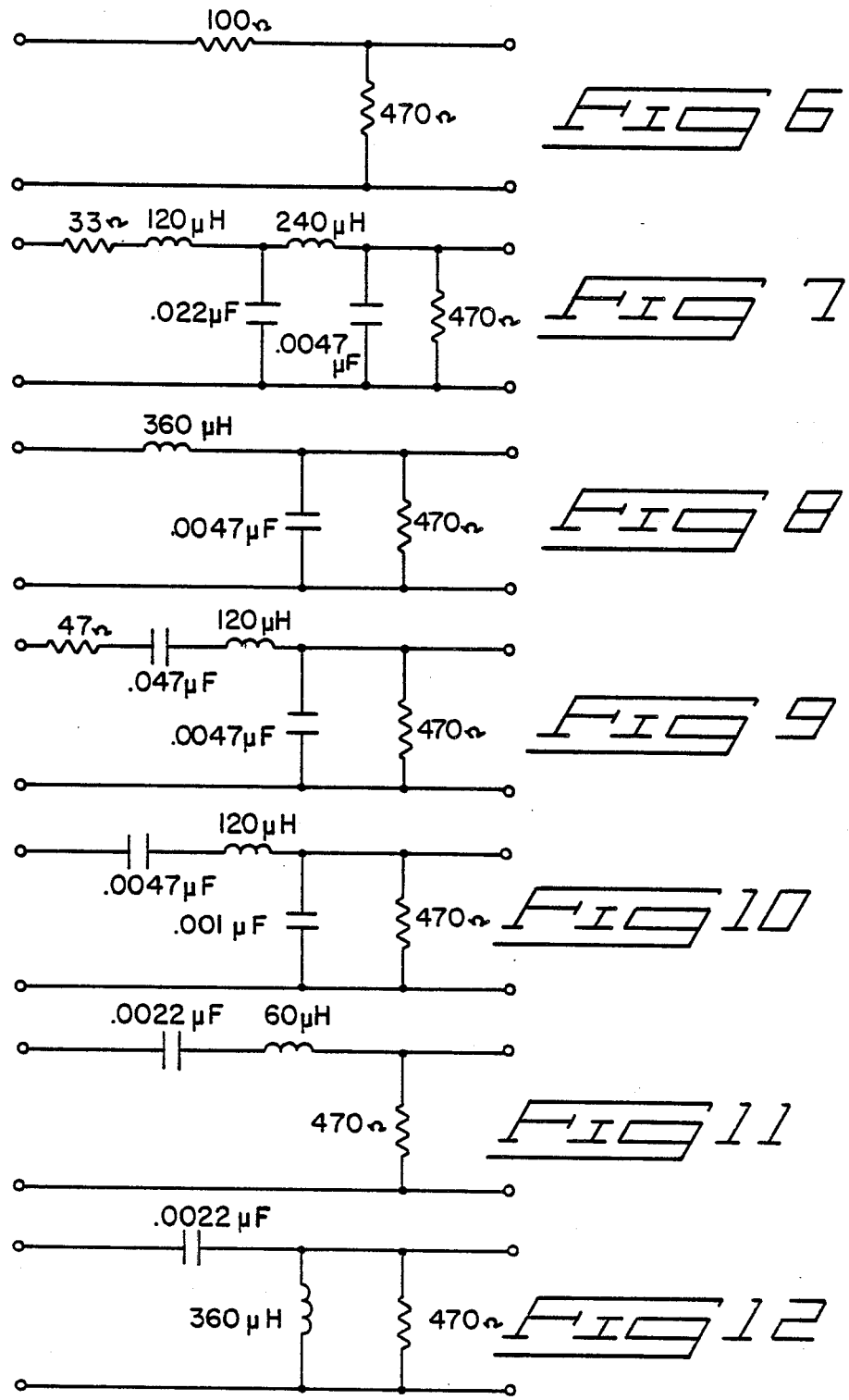

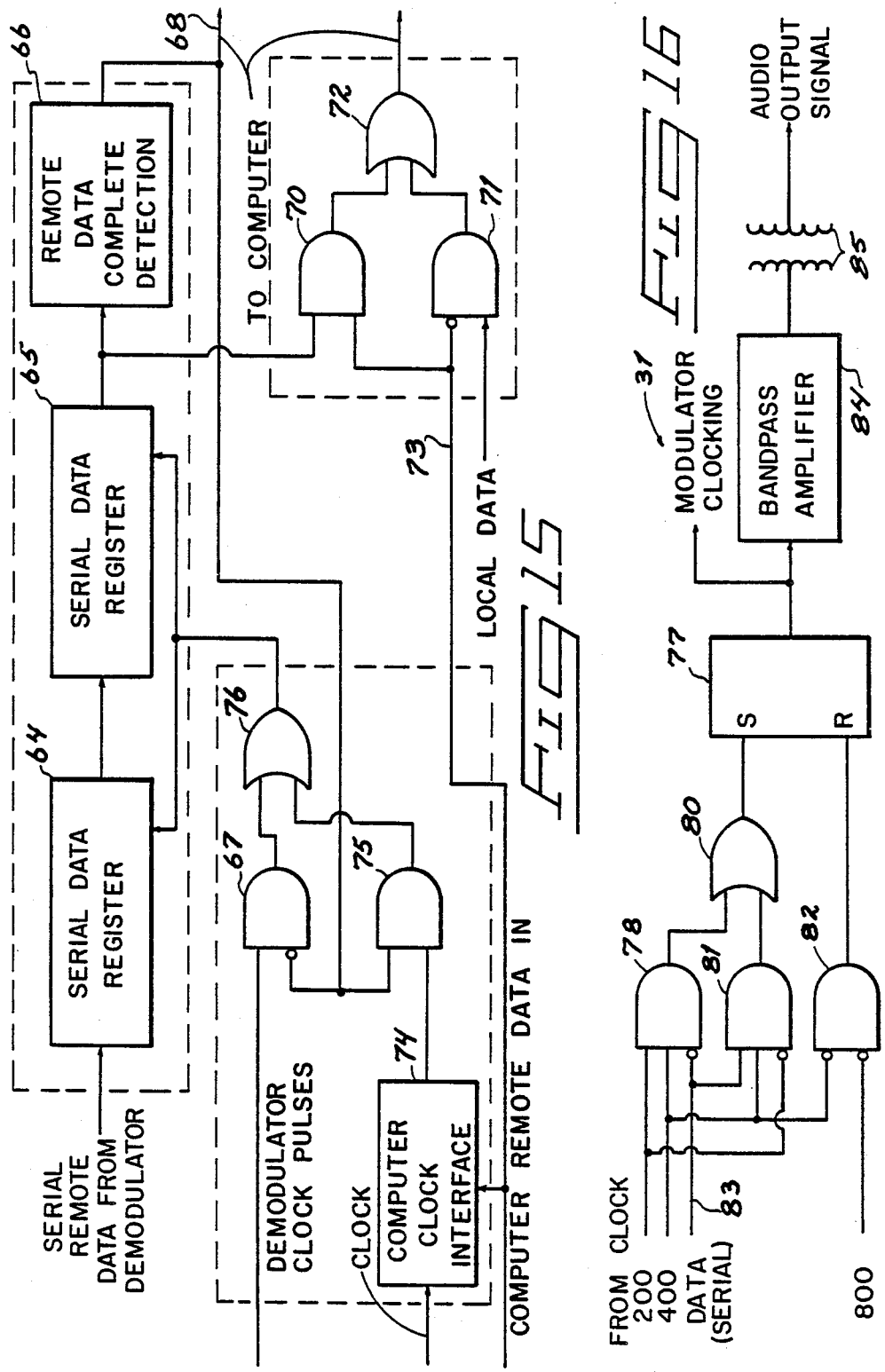

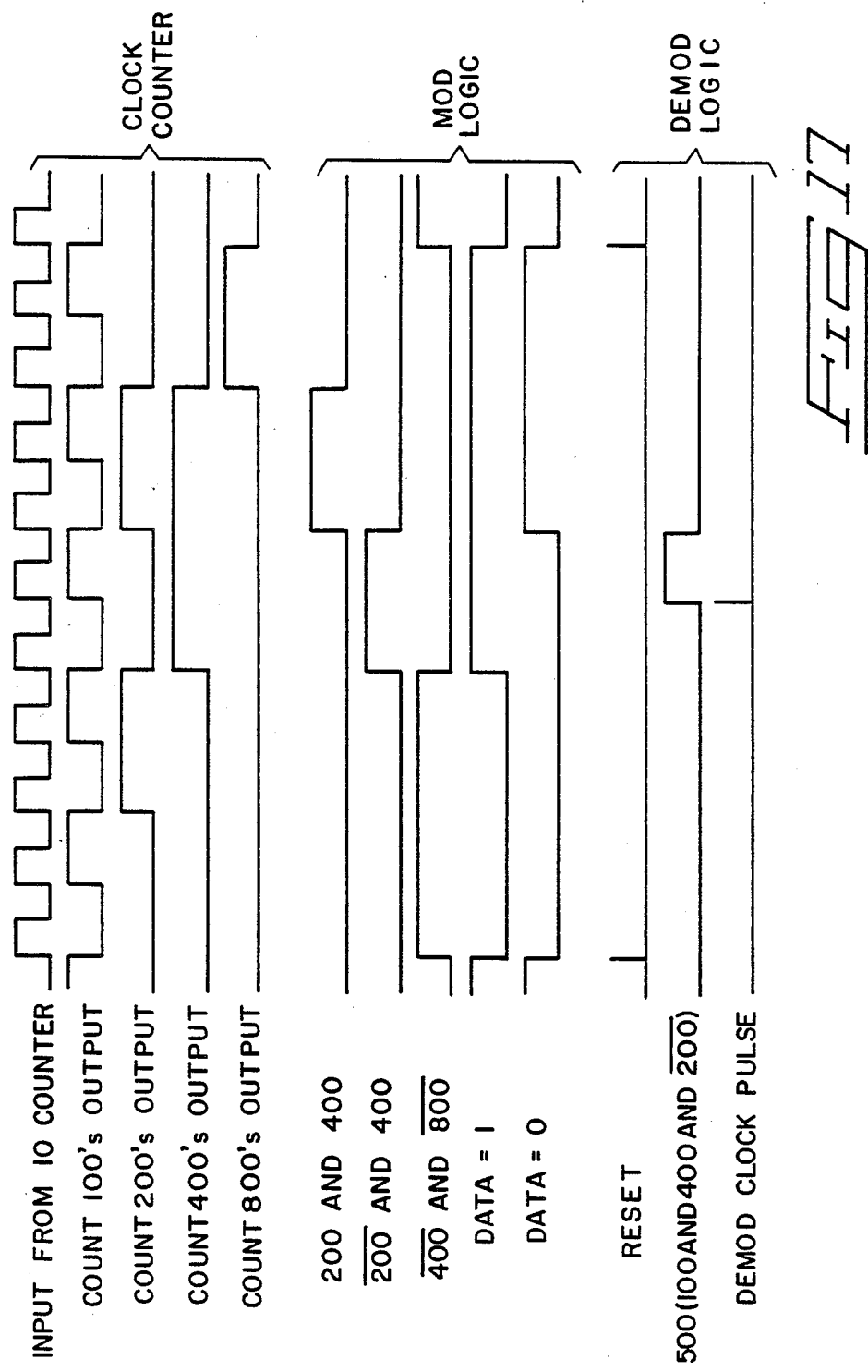

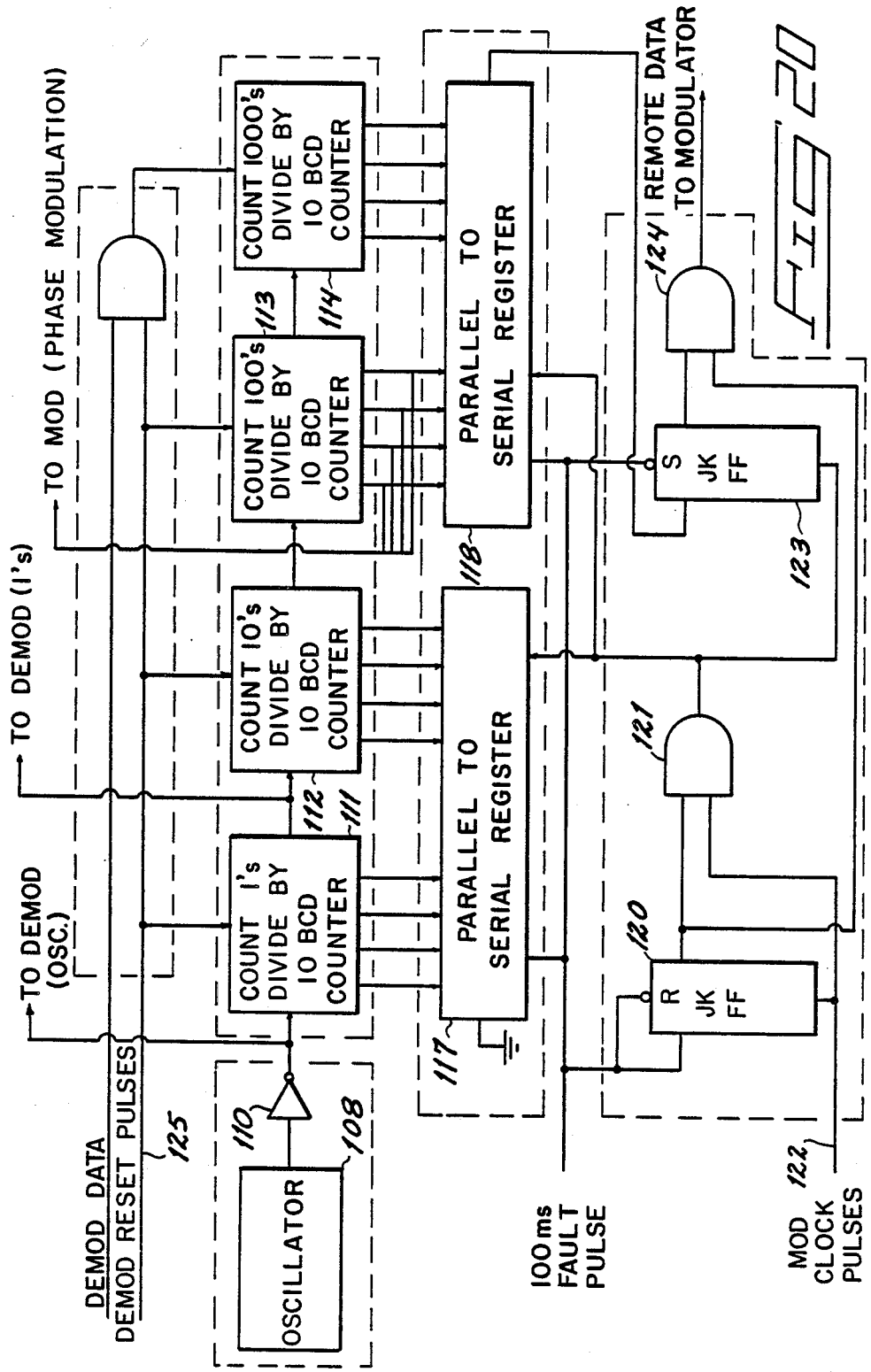

FAULT FINDER

BACKGROUND OF THE INVENTION

The present invention relates generally to automated circuitry for detecting and locating faults in electrical transmission lines. It comprises electronic circuits at both a master unit and a remote unit linked to one another through conventional communication facilities.

This disclosure relates to a unique system for synchronizing operation of a remote and master unit, and for facilitating transfer of information between them through a conventional communication line. It eliminates the need for more expensive specialized communication facilities required by systems that preceded it.

An earlier automatic fault locating system is described in IEEE conference paper C 72 513-0, titled "Automatic Fault Locator for Bonneville Power Administration" by Marihart and Haagenson, printed in 1972. The described system initiates a start pulse when the fault is detected at the master unit. A signal from the remote terminal is transmitted by microwave to the master unit as a stop pulse. The time between pulses is interpreted in units of miles from the fault to the remote terminal. The paper discusses input filter requirements and details of the circuitry.

Another article summarizing methods for fault detection is AIEE paper 57-160, titled "Fault Location MEthods for Overhead Line" by Stringfield, Marihart, and Stevens. It discusses development of timing signal and time interval counters prior to currently available microprocessor technology. A system is discussed as "Type D" beginning at the bottom of page 525, where surges travel toward opposite ends of a line, are detected upon arrival and are made to stop synchronized electronic counters at the two ends. The readings at the two ends are then determined by separate operators, who can telephone the readings to a dispatcher. The article discusses the problem of triggering the equipment by unwanted pulses, such as noise, lightning near misses, and surges from other parts of the system, which would then disable the device until it is manually reset.

A digital fault location system is described in U.S. Pat. No. 4,107,778, issued Aug. 15, 1978. It utilizes a digital computer which detects the occurrence of a fault in the power transmission line and calculates the distance from the detection point to the fault. Voltage and current information is received through electric communication lines to arrive at distance calculations.

SUMMARY OF THE INVENTION

It is an object of this invention to provide an improved fault detection circuit which automatically compensates for real-time background noise occurring along the monitored electrical transmission line.

Another object of the invention is to provide an improved variable filter system for a fault signal detector.

Another object of the invention is to provide synchronized detection circuits at two separated locations along an electrical transmission line by use of conventional communication line facilities. The same communication line facilities are also used for transmitting fault detection information from a remote station to a master station.

Another object of the invention is to utilize microprocessor capabilities in handling digital information relating to fault detection at two separated locations.

Additional objects, advantages and novel features of the invention will be set forth in part by the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purposes of the present invention as embodied and broadly described herein, the apparatus of this invention may comprise fault detection circuit means at a master unit and at a remote unit along an electrical power transmission line for distinguishing between background line noise and an incoming fault pulse, and for producing a logic fault signal at each unit. Master unit and remote unit clock means are utilized for providing constantly changing numerical output signals representative of distance along the line. A modulator is operatively connected to the master unit clock means for transmitting clock signals over a communication line to the remote unit. A demodulator is provided at the remote unit for receiving the clock signals and for synchronizing operation of the remote unit clock means to operation of the master unit clock means. Master unit data means is operatively connected to the master unit fault detection circuit means and clock means for producing a binary outout signal in response to a logic fault signal produced by the master unit fault detection circuit means, the binary output signal being representative of distance to the fault. Remote unit data means is operatively connected to the remote unit fault detection circuit means and clock means for producing a binary output signal in response to a logic fault signal produced by the remote unit fault detection circuit means, this binary signal also being representative of distance to the fault. A modulator is operatively connected to the remote unit data means for modulating the binary output signals and transmitting the modulated signals to the master unit over the communications line. A demodulator for these signals is provided at the master unit, along with microprocessor means for processing both the binary output signals produced by the master unit data means and by the remote unit data means to produce a distance output value representative of the location of a fault along the line.

The present method basically involves monitoring all wave forms other than line frequency at both a master unit location and a remote unit location along an electrical power transmission line, discriminating between fault surges and repetitive background line noise, developing a logic fault signal at each unit in response to a fault pulse, synchronizing a remote unit clocking system with a master unit clocking system by modulating signals produced by the master unit clocking system and transmitting them over a conventional communication line for demodulation at the remote unit, producing binary output signals at both the master unit and remote unit in response to a logic fault signal, the binary output signal being representative of distance, transmitting a modulated binary output signal from the remote unit to the master unit over the communication line, and electronically processing the binary output signals to produce a distance output value representative of the location of the fault along the line.

BRIEF DESCRIPTION OF THE DRAWINGS

The accompanying drawings, which are incorporated into and form a part of the specification, illustrate an embodiment of the present invention and, together with the description, serve to explain the principles of the invention. In the drawings:

FIGS. 6 through 12 show circuit details of various filter switch positions;

FIG. 15 is a block diagram of the circuitry for local/remote data control;

FIG. 16 is a block diagramn of a modulator;

FIG. 17 is a modem timing diagram;

FIG. 20 is a block diagram of the remote unit logic circuitry.

GENERAL DESCRIPTION

The Fault Finder is designed to measure the location of a high voltage transmission line fault at the time the fault occurs. The basic principle of fault location through pulse detection and timing measurement has been well known for over twenty years. The present Fault Finder is a unique system which includes new techniques that reduce false operation from noise and greatly broaden the commercial application of electronic fault detection to use by any power company. With this device, fault measurement will no longer be limited to companies which can provide wide band communication facilities. Cost is minimized through the design which includes communication modems as an integral part of the design and use of readily available communication lines and microprocessor techniques.

The function of the Fault Finder is to detect an incoming fault pulse at each end of the monitored transmission line 10 and to translate the time difference of receipt of the pulses into a distance reading to locate the fault.

Figure 1:
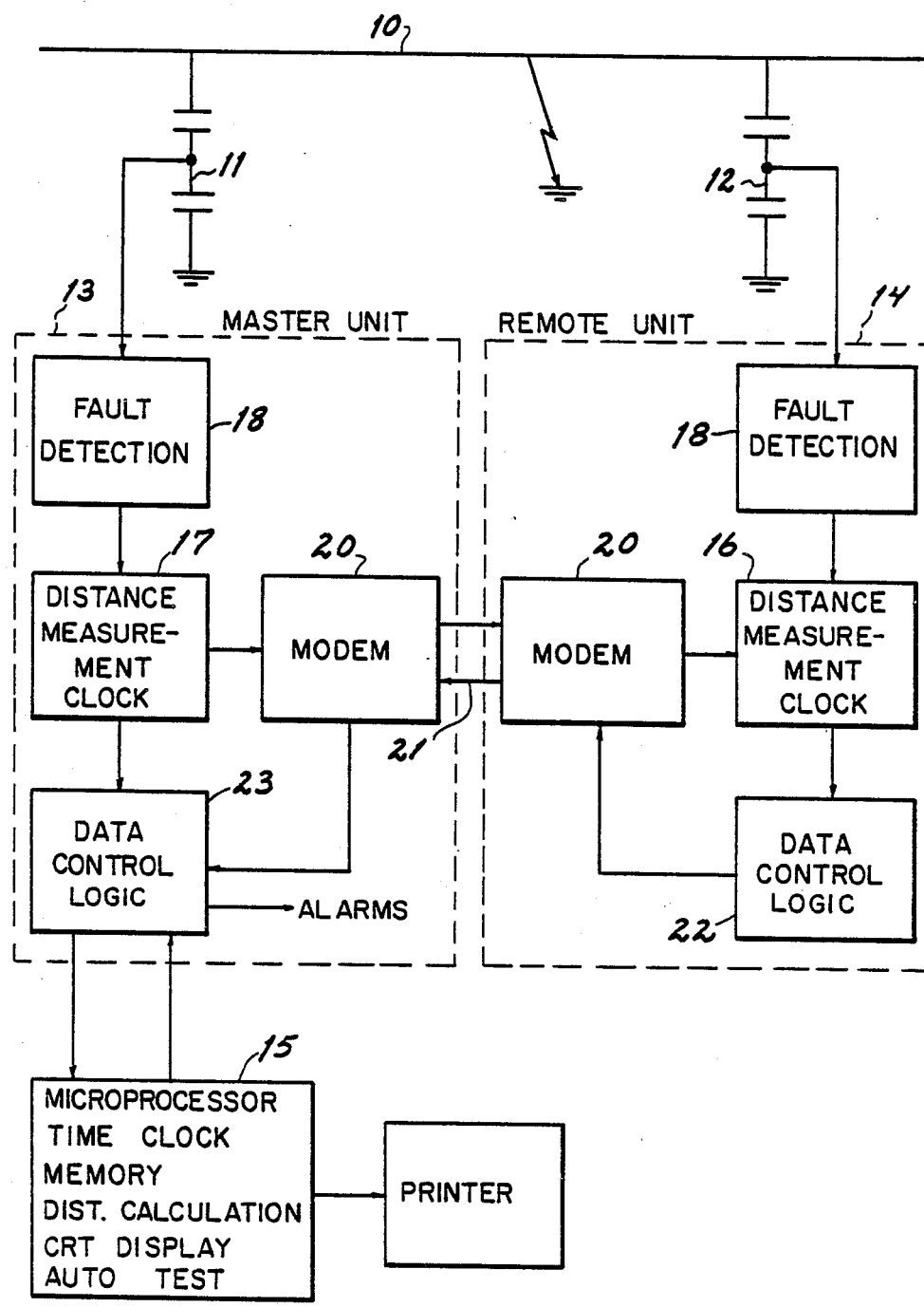
FIG. 1 is a block diagram of the fault finder system.

In FIG. 1 it will be seen that the Fault Finder consists of three basic units, a Master Unit 13, a Remote Unit 14, and a Microprocessor 15. The Master Unit 13 and Remote Unit 14 are physically separated along the length of transmission line 10 being monitored for faults, and are respectively connected to the line 10 by couplings 11 and 12. The Remote Unit includes a Remote Unit Clock 16 synchronized to a Master Unit Clock 17. The readings of the two clocks 16, 17 will be slightly different because of the delay in time required for the synchronizing signal to travel from the Master Unit 13 to the Remote Unit 14. Since the resulting difference is a constant value, correction can be made when fault distances are calculated by Microprocessor 15.

Both the Master Unit 13 and the Remote Unit 14 include a Fault Detection circuit 18 and Modem circuitry 20 which are identical at both ends. The clocks 16, 17 and logic circuitry 22,23 in the two Units are different to accommodate their differences in function. The Master Unit 13 includes interface circuitry to the Microprocessor 15 and has provision for receiving data from the Remote Unit 14 over the communication circuit 21.

A conventional microprocessor and associated peripheral hardware can be utilized to keep track of current date and time, distance calculations, memory of previous faults, display of fault distances, and printouts.

MASTER UNIT

Figure 2:
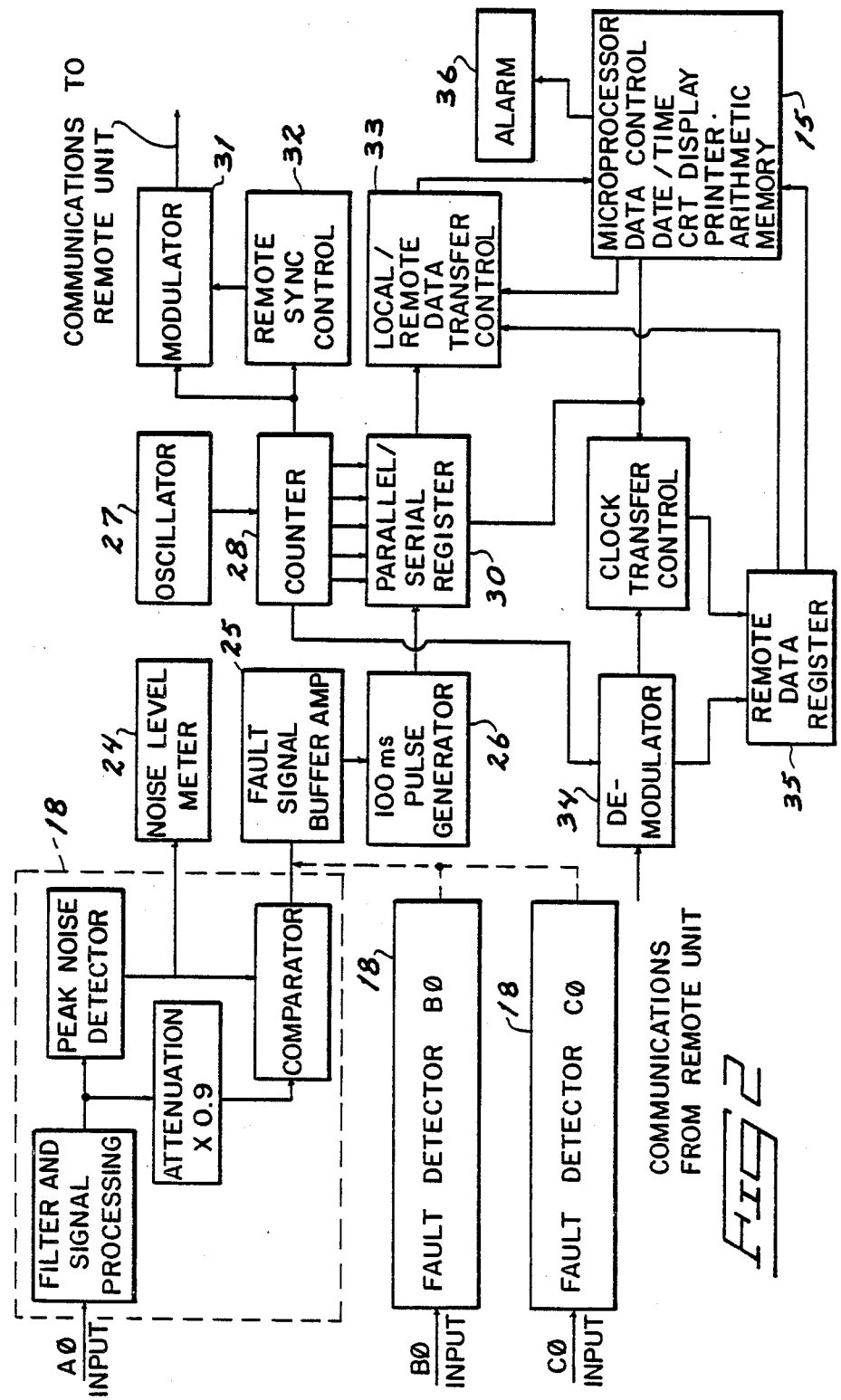
FIG. 2 is a block diagram of the master unit.

The incoming fault signal to the Master Unit 13 (FIG. 2) inputs to a Fault Detection Circuit 18 which is used to distinguish between background noise and an incoming fault impulse. A noise level meter 24 is provided as indication of background noise level. The output of the Fault Detection Circuit 18 is isolated and shaped by Buffer Amplifier 25 which triggers a logic fault signal in the form of a 100 ms output pulse at a pulse generator 26. The length of the 100 ms pulse prevents interference from additional Fault Detection Circuit 18 inputs while data is being processsed. At the end of 100 ms the Master Unit 13 is reset in readiness for the next fault signal.

The Master Unit Clock 17 serves two functions—as a distance measurement clock, and as a synchronizing clock. The distance measurement clock function is provided by Oscillator 27, Counter 28, and Register 30. The Oscillator 27 and Counter 28 provide a continuously changing number which is directed to the input of Register 30. The start of the 100 ms pulse freezes the count present at Register 30 which serves as a binary output signal that is the fault clock value of the Master Unit 13.

Counter 28 is also used to provide modulation signals which are synchronized with operation of the Master Unit clock 17. The modulated signal is transmitted to Remote Unit 14 and from Modulator 31 and Remote Synchronization Control circuit 32 and is used to synchronize operation of the Remote Unit clock 16 with the Master Unit 13.

Upon detection of a fault, the Microprocessor 15 will transfer the master fault clock value Register 30 through Local/Remote Data Transfer Control 33 into the Microprocessor 15. The Microprocessor 15 will then wait for receipt of the fault clock data from the Remote Unit 14.

Remote fault clock data is received at the Master Unit 13 by Demodulator 34 and stored in a Remote Data Register 35. When the complete data has been received, Register 35 signals Microprocessor 15 that remote data is ready. The Microprocessor 15 then transfers the remote fault clock value from Register 35 through Local/Remote Data Transfer Control 33 to the Microprocessor 15.

The Microprocessor 15 then processes the data by calculating the fault distance from the two fault clock values. It can convert the information to distance measurements and assist in locating the fault by displaying and printing the data. The Microprocessor also can activate an Alarm 36 to provide an audible or visible signal that fault data has been processed.

Fault Detector

The function of the Fault Detection Circuit 18 is to process the incoming signals from transmission line 10 in such a way as to distinguish between a fault signal and background line noise, and to generate a 100 ms pulse as a logic fault signal when a fault signal is detected.

Figure 3:
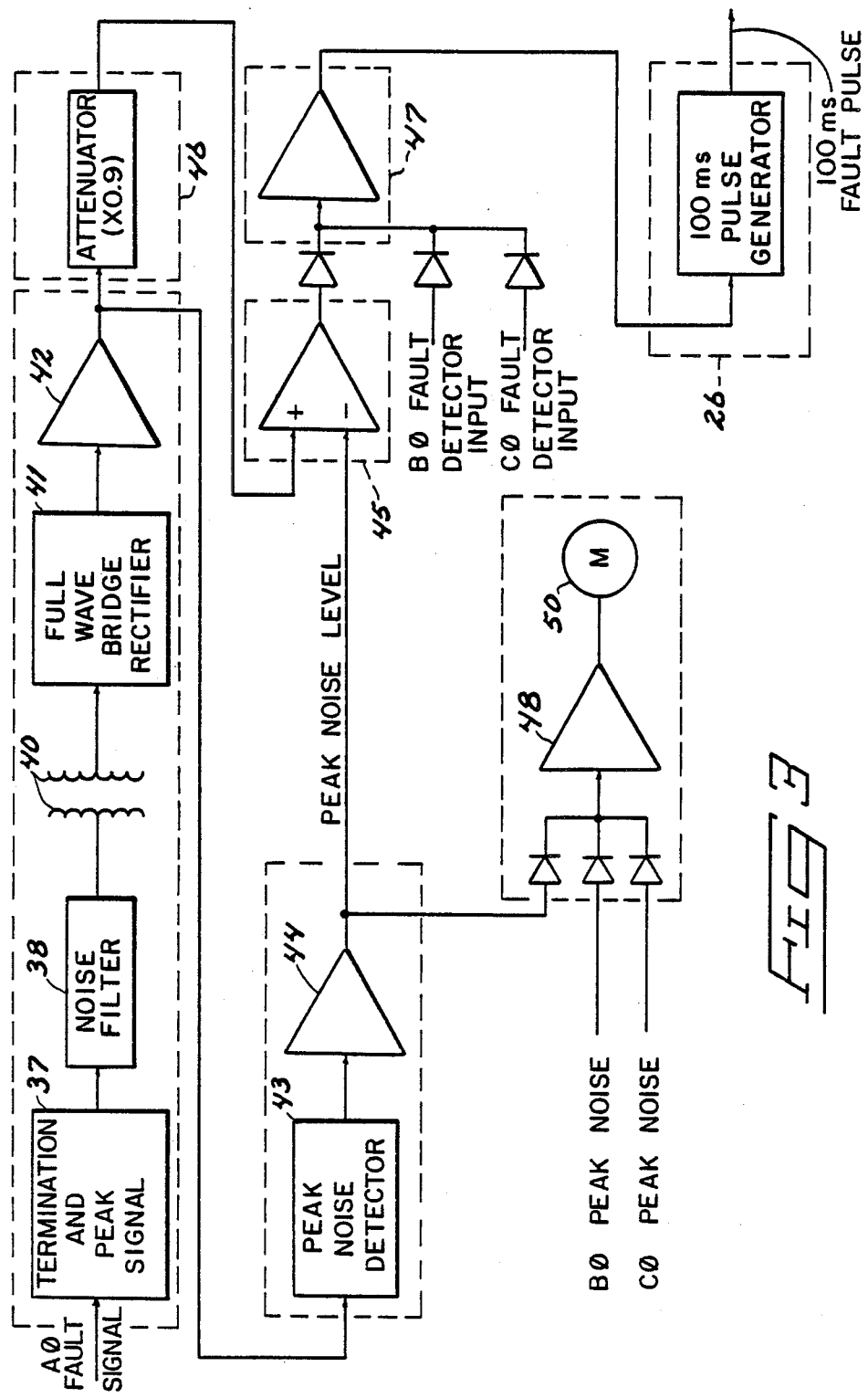
FIG. 3 is a functional block diagram of the fault detection circuitry.

The circuit diagram in FIG. 3 shows details of one of three such circuits that are included to individually process each of three inputs from a typical three phase transmission network. Unique features of the unit are: (1) an adjustable noise filter which will provide maximum rejection to noise without affecting sensitivity to the fault signal; (2) automatic adjustment of sensitivity to continually keep the sensitivity to fault signal at 1.1 times the background noise. A description of noise filter details is included below. The automatic sensitivity adjustment has fast attack, slow decay time constants chosen so that a single fault will not prevent response to a second or third fault. Decay timing is sufficient to bridge the expected time between periodic noise bursts.

The incoming fault signal is terminated at a Termination and Peak Signal Clipper 37 in the characteristic impedance of the incoming cable. Peak clipping is provided to prevent damage of internal circuitry from excessive electrical input from either high signal level or power system equipment failure. The signal is then filtered by Noise Filter 38 to provide maximum rejection of background noise (see detailed filter description below). An isolation impulse transformer 40 is used to isolate remote station grounding (incoming signal cable shield) from local ground as a means of reducing EMI transient responses which would otherwise interfere with operation of the Fault Finder.

A full wave rectifier bridge 41 is used to output positive signals with equal sensitivity for both negative or positive inputs. A buffer Amplifier 42 isolates loading of following electronic circuits from the full wave rectifier bridge output and also shapes the resulting signal.

The signal produced by peak noise detector 43 goes to a Buffer Amplifier 44 which prevents loading of following electronic circuitry from affecting the desired time constants. The peak noise level from the Buffer Amplifier 44 is used as a reference signal for a voltage comparator 45. The fault signal from the Buffer Amplifier 42 is attenuated by an Attenuator 45 by 0.9 and compared with the peak noise level in the Comparator 45. When a fault signal occurs, it must exceed the previous peak noise by a factor of 1.1 to generate an output at Comparator 45 output. The peak noise level input will increase slightly but will not desensitize the unit to subsequent faults because of the delay characteristic of the Peak Noise Detector 43.

The output of each Comparator 45 is combined with the outputs of other fault detectors for the associated transmission lines and is directed to a Buffer Amplifier 47. The Buffer Amplifier 47 changes the logic level from that of the comparator 45 to the correct level required for operation of the 100 ms Pulse Generator 26. The 100 ms Pulse Generator 26 provides timing for the Fault Finder to perform necessary logic and arithmetic functions prior to accepting another fault signal. At the end of the 100 ms period, logic is reset in readiness for the next fault occurrence. A Meter Amplifier 48 combines the peak noise inputs from the several monitored lines into a single maximum reading on the Peak Noise Meter 50.

Figure 4:
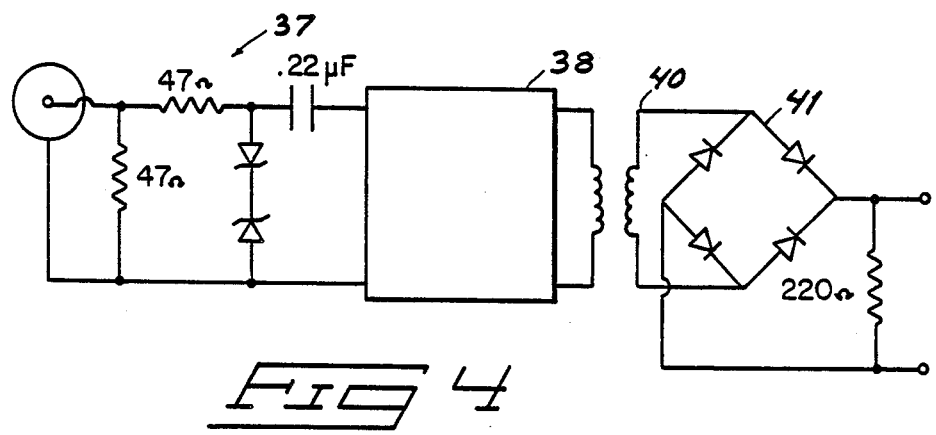
FIG. 4 is a wiring diagram of the fault input signal circuitry.

A typical circuit board layout for processing of input signals is shown in FIG. 4, which shows one of three identical input signal boards for a three phase transmission line network.

FILTER

Figure 5:
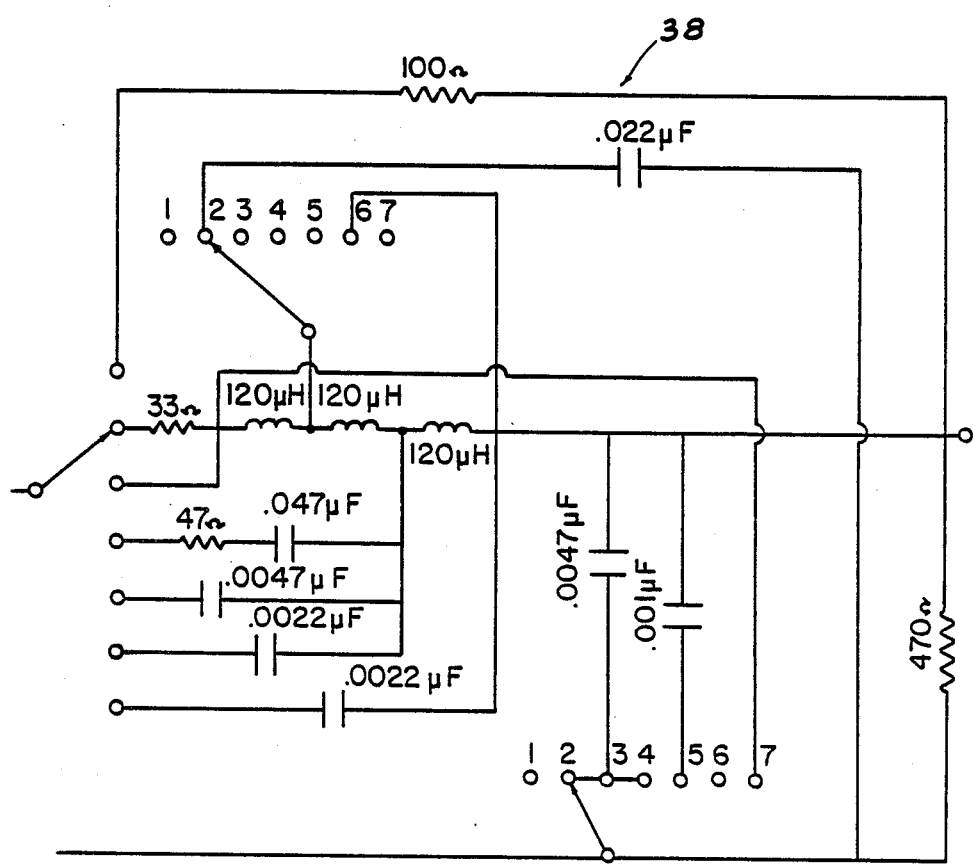
FIG. 5 is a wiring diagram of an input filter.
Figure 13:
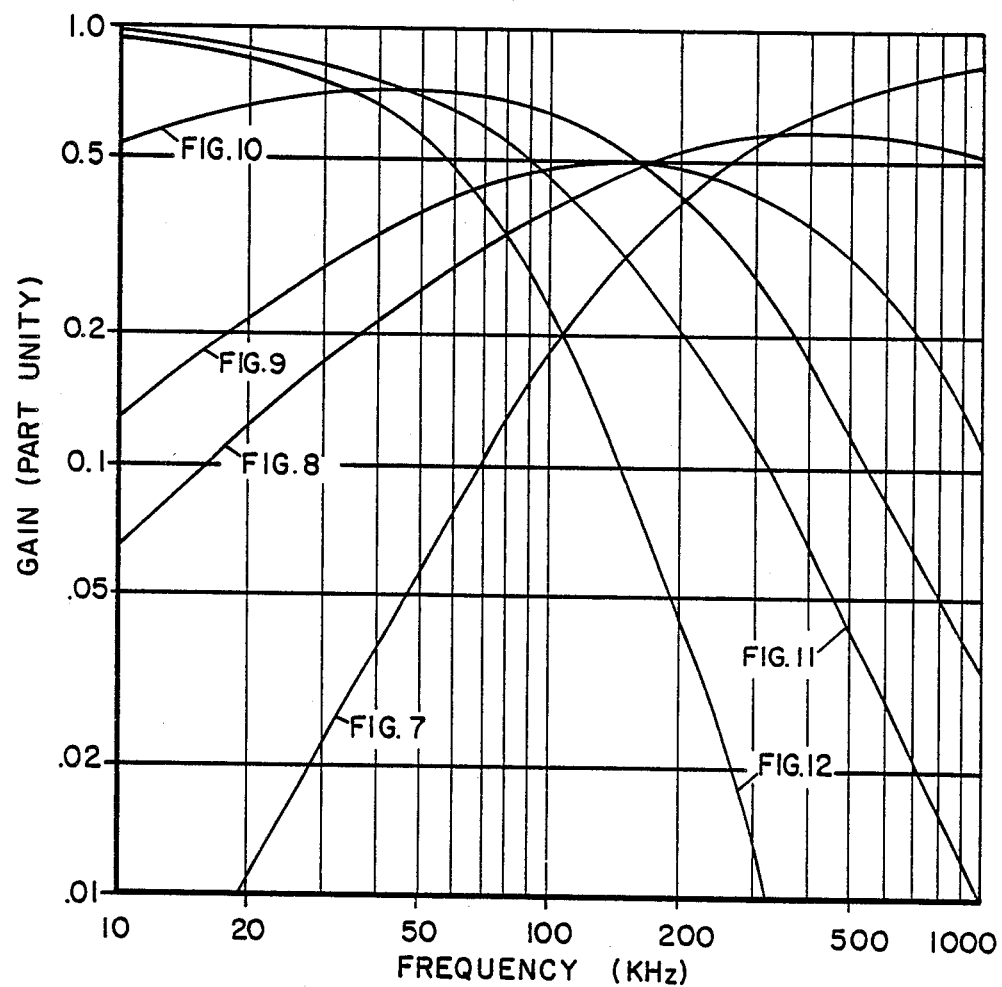
FIG. 13 is a plot of filter characteristics.

The Noise Filter 38 (FIG. 5) provides a choice between six filter configurations and one bypass setting with no filtering (position 1). FIG. 13 shows the effective range of filtering for each of the seven switch positions. The filter is designed to pass a fault signal with only slight attenuation while providing low pass, band pass, and high pass filter characteristics without loss of filter performance due to filter resonant ringing as occurs with many standard designs.

The complete filter includes switching for selection of the best filter as needed for each individual installation. Schematic diagrams included as FIGS. 6-12 show the filter design for each switch position. The combined filter shown in FIG. 5 utilizes some elements in more than one filter configuration. The filter characteristics for each switch position can be identified in FIG. 13.

MASTER UNIT DATA

Figure 14:
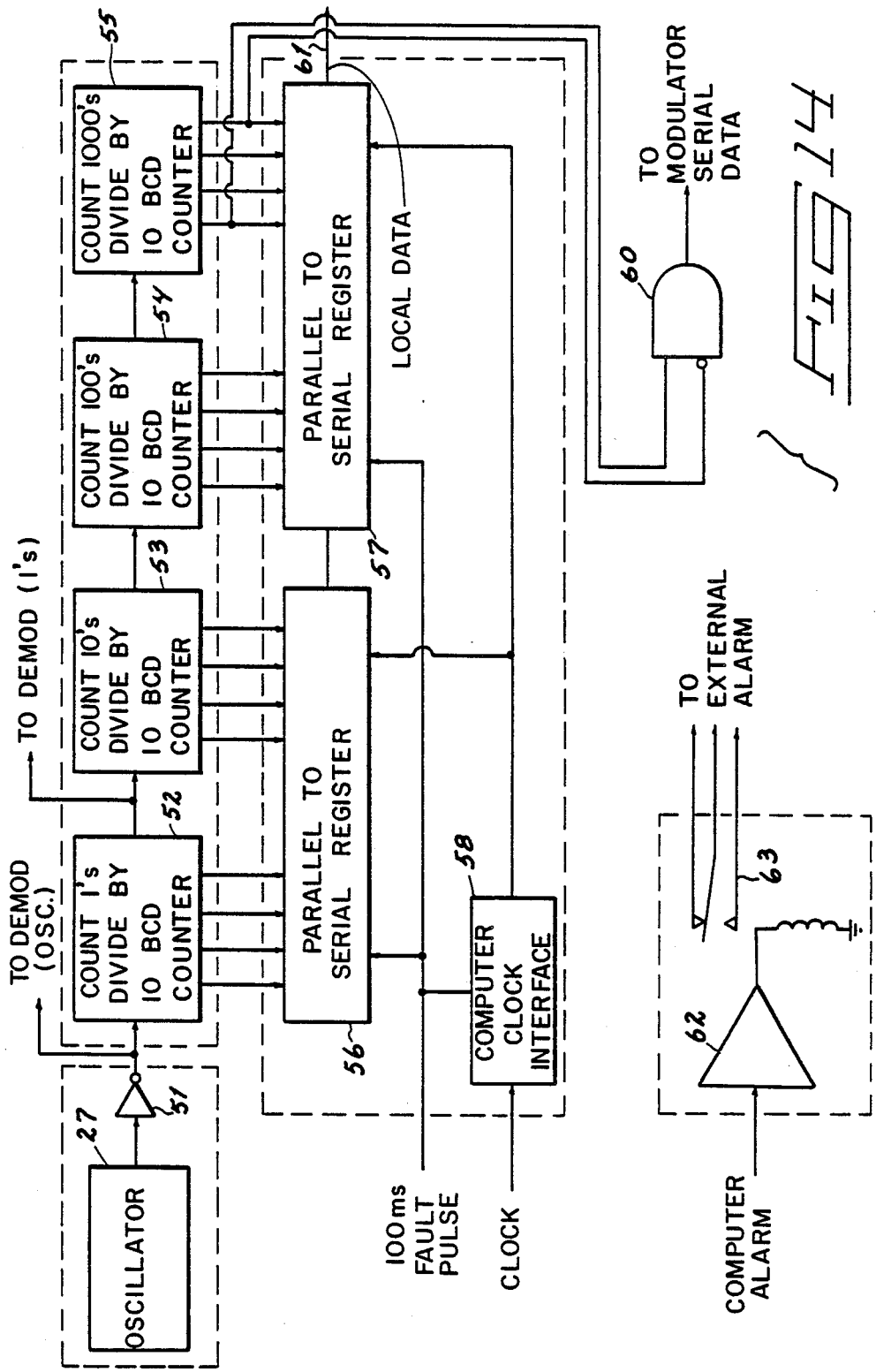
FIG. 14 is a block diagram of the local data circuitry for the master unit.

Local data in the form of a binary output signal representative of distance along the line 10 from the Master Unit 13 to the location of the fault is generated through an oscillator-counter arrangement shown in FIG. 14. The oscillator 27 produces a sine wave at 926,000 cps. The Buffer 51 converts the sine wave signal to a continuous square wave signal compatible with the logic system used. The oscillator square wave signal is the source for four "Divide-by-Ten" BCD Counters 52, 53, 54 and 55. The choice of frequency is such that the counter value is a constantly changing numerical output signal that is representative of distance along the power transmission line. The resulting oscillator and counter wave forms are also used in the Modulator 31 and Demodulator 34 to provide a communication method between Master Unit 13 and Remote Unit 14 that is synchronized with operation of the oscillator 27.

When a fault occurs, the 100 ms Fault Pulse generated by the Fault Detection circuit 18 transfers the parallel to serial shift registers 56 and 57 to the serial mode and thereby freezes the count that is present at the start of the Fault Pulse.

The 100 ms pulse also enables the computer clock interface 58 to receive clock pulses from the Microprocessor 15 for transferring serial data out of the parallel to serial registers 56, 57 to the Local/Remote Data Transfer Control 33 at output 61.

Also shown is provision made by a gate 60 for synchronizing a remote 1000 counter in the Remote Unit 14 to the Master Unit 13. Every Count 8000 and $\overline{1000}$ a 1 signal is sent to the Modulator 31 from gate 60.

Computer alarming provision is made through the Alarm Buffer 62 and Isolating Relay 63. When the Microprocessor 15 outputs an alarm command the Alarm Relay 63 will be activated.

MASTER UNIT/REMOTE UNIT DATA TRANSFER CONTROL

The Local/Remote Data Transfer Control 33 is used to store remote data and select either local or remote data to be serially clocked into the Microprocessor 15 as shown in FIG. 15.

Remote data from the Demodulator 34 is clocked into Serial Data Registers 64, 65 as it is received. The Remote Unit 14 sends data zeros when no fault data is to be transmitted. An extra "1" data bit is added to the front of each transmission. When the "1" data bit has clocked through the Serial Data Registers 64, 65 and through the Remote Data Complete Register 66, clocking from the Demodulator 34 is cut off by gate 67. The resulting Remote Data Complete information signal at output 68 also goes to the Microprocessor 15 as an indication that remote data can be clocked into it.

Data selection of local or remote data to be clocked into the Microprocessor 15 is made in gates 70, 71 and 72. First, local data is clocked through gate 71 with the Computer Remote Data In line 73 low. Data is routed through gate 72 to the Microprocessor 15. After completing the transfer, and receiving the Remote Data Complete indication, the Microprocessor 15 shifts the Remote Data In line 73 high and clocks Remote Data from the Serial Data Registers 64, 65 through gate 70 and 72 to the computer. Microprocessor clocking for these data transfer steps is provided through gates 74, 75 and 76.

MODULATOR

Modulator 31 (FIG. 16) is used to transfer timing data and precise timing pulses from the Master Unit 13 to the Remote Unit 14. A similar modulator transfers data from the Remote Unit to the Master Unit.

The Modulator 31 develops a phase modulated signal that is in synchronism with the Fault Finder Master Clock 17. If a "1" bit is to be transmitted, the 0 to 1 signal transition is made at count 400, (see timing Diagram in FIG. 17, Data=1). If an "0" bit is to be transmitted, the 0 to 1 signal transition is made at count 600, (see timing Diagram in FIG. 17, Data=0). The 1 to 0 transition is always made at count 0 and is used for timing.

The Modulator 31 requires three inputs from the clock counter: "count 200", "count 400", and "count 800". The serial data signal from local/Remote Data Transfer Control 33 (FIG. 15) is transmitted. If the serial Data is "1", the R-S FlipfLop 77 is set through gates 78 and 80 at count 400. If the serial data signal is "0", the R-S Flipflop 77 is set through gates 81 and 80 at count 600. The R-S Flipflop 77 is always reset at "counter reset" by counter logic 400 and 800 signals provided by gate 82. The output of the R-S Flipflop 77 is also used to clock in new serial Data into the Modulator through line 83.

The phase modulated Logic signal from R-S flipflop 77 is conditioned through a bandpass amplifier 84 to fit the bandpass requirements of a normal communications circuit. EMI and signal isolation is provided by signal isolating transformer 85.

DEMODULATOR

Demodulator 34 (FIG. 18) is used in the Master Unit 13 to decode incoming audio signals from Remote Unit 14 into serial data information. A similar demodulator is used in the Remote Unit 14 to provide timing synchronization between the Master and Remote Units 13, 14.

An isolation transformer 86 is used between the incoming signal and the Fault Finder to isolate remote grounding from local grounding to provide EMI isolation for the Fault Finder. Amplifier 87 is used to amplify the incoming signal to a level that will provide accurate detection of signal zero crossings. Comparator 88 detects signal zero crossings and converts the incoming signal into phase modulated logic level serial information. The Peak Detector 90 is used to establish an indication of incoming signal level. Comparator 91 compares the signal level with a known reference level. The function of this circuitry (Peak Detector 90 and Comparator 91) is to allow operation if signal level is adequate for accurate operation. If the signal level drops too low, inaccurate operation of the demodulator will be prevented by gate 92. A usable operating range of +5 to −2 db is provided by this means. JK Flipflops 93, 94 are used to delay the serial data by 2 clock pulses.

Accurate timing is generated at the negative going (1 to 0 state) of the incoming serial data. (Refer to Modem timing diagram in FIG. 17, Data=1, Data=0, and Reset). When the Serial Data from comparator 91 goes low, a reset pulse is generated at the output of gate 95. The next oscillator clock pulse sets the JK Flipflop 96 which cuts off the reset pulse output of gate 95. The reset pulse thus generated has a pulse length of about 1 microsecond and can be used for accurate timing. Synchronization of the Remote Unit 14 is provided at the output of a gate 97. Gate 97 provides the reset function for only 1 to 0 transitions following receipt of serial data "0". A slight timing difference is introduced by serial data "1" so that gate 97 functions to eliminate undesirable timing jitter that would otherwise occur.

The incoming signal is phase modulated on the positive (0 to 1) transition. (See Data=1 and Data=0 on the timing diagram in FIG. 17. A logic "0" or "1" signal is detected by delaying from the negative sums "1" to "0" timing transition to a point on the waveform that will always be the same as (1 or 0) the logic signal which is to be decoded. Delay for the detection is accomplished by counters 98 and 100 and gates 101, 102, and 103. Counters 98 and 100 are reset to zero at the signal negative 1 to 0 transition by the Reset Pulse (output of gate 95). Counters 98 ad 100 then count 1's from the Fault Finder Clock 17. At count 500 gate 101 produces a "1" output which in turn produces a "1" output from gate 103. After one clock pulse the gate 102 provided by a JK Flipflop is set, which cuts off gate 103 and produces a short pulse at count 500. This pulse is used to clock the demodulator serial data. The phone modulated data at the output of gate 92 will have shifted to a "1" state at count 400 if a data 1 is being demodulated. If a data 0 is being demodulated the shift to a "1" state will not occur until count 600 (see timing Diagram in FIG. 17, Data=1 and Data=0). By clocking JK Flipflop 93 at count 500, the incoming 1 or 0 phase modulated data transferred into serial data which is sequentially clocked through JK Flipflop 93. The output of JK Flipflop 94 is the demodulator output.

REMOTE UNIT

Overall Description

Figure 19:
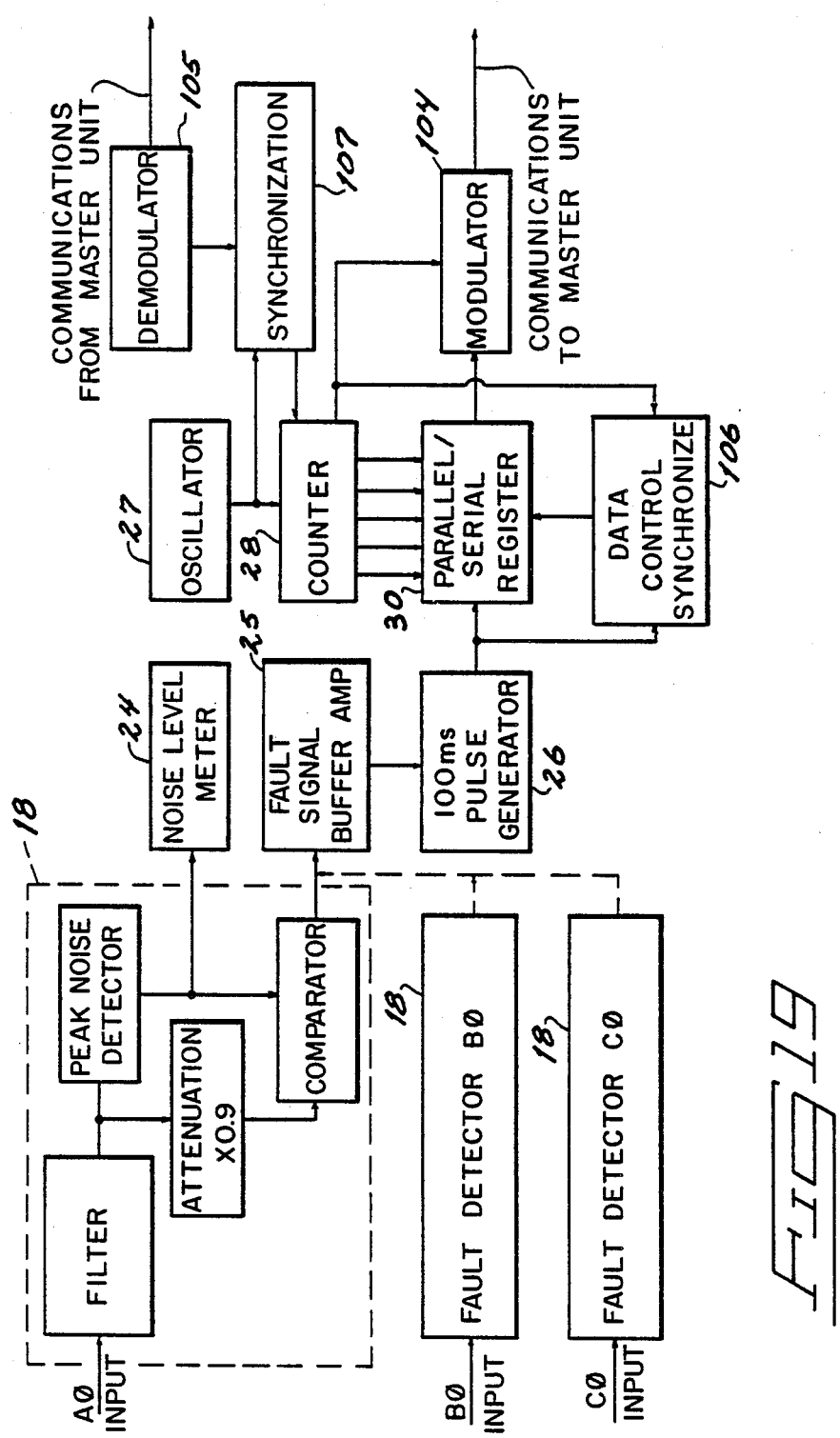
FIG. 19 is a block diagram of the remote unit circuitry.

The incoming fault signal to the Remote Unit 14 (FIG. 19) inputs to the Fault Detection Circuit 18 which is used to distinguish between background noise and an incoming fault impulse. A noise level meter 24 is provided as indication of background noise level. The Fault Signal output of the Fault Detection Circuit 18 is isolated and shaped by Buffer Amplifier 25 which triggers a 100 ms output Pulse at a pulse generator 26. The 100 ms pulse prevents interference from additional Fault Detection Circuit 18 inputs while data is being processed. At the end of 100 ms the Remote Unit 14 is reset to be in readiness for the next fault signal.

The distance measurement clock function is provided by Oscillator 27, Counter 28, and Register 30. The start of the 100 ms pulse freezes the count present at Register 30 and is the fault clock value of the Remote Unit 14.

Counter 28 is used in the modulation process by Modulator 104 to provide modulated signals which are synchronized with operation of the Remote Clock 16. When a 100 ms pulse is generated, the Data Control Synchronize Circuit 106 delays until data clocking can be synchronized with the modulator signal. The Remote Unit fault clock value moves serially from Register 30 to Modulator 104 to be sent to the Master Unit.

Incoming communications from the Master Unit are converted by the Demodulator 105 and Synchronization Circuit 107 into timing pulses that reset Counter 107 and provide count synchronization between the Master and Remote Units 13, 14.

The Remote Unit Fault Detection Circuit and Filter are identical to the circuits described and shown as part of the Master Unit (FIGS. 3-13).

Figure 18:
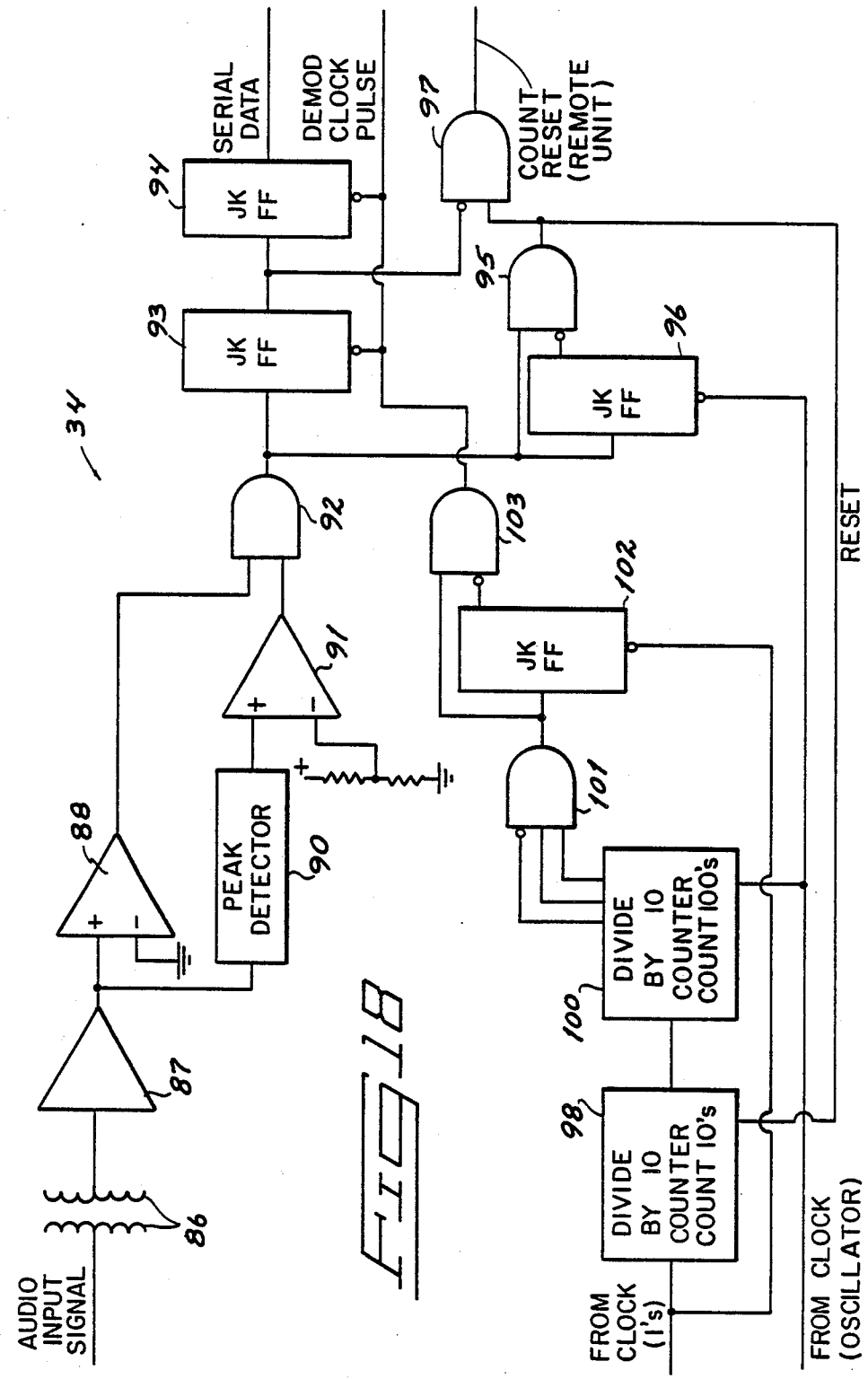
FIG. 18 is a block diagram of a demodulator.

The Remote Unit Modulator and Demodulator are also identical to the circuits described and shown in FIGS. 16 and 18.

REMOTE LOGIC UNIT

Remote Unit fault timing data is generated by an oscillator-counter arrangement shown in FIG. 20. Oscillator 108 produces a sine wave at 926,000 cps. The Buffer 110 converts the sine wave to a continuous square wave signal compatible with the logic system used. The oscillator square wave signal is the source for four Divide-by-Ten BCD counters 111, 112, 113, and 114. The choice of frequency is such that the counter value is representative of mileage on a power transmission line. The resulting oscillator and counter waveforms are also used in the Modulator 104 and Demodulator 105 to provide an end to end communication method for the system that is synchronized with the oscillator 27 of the Master Unit 13.

When a fault occurs the 100 ms Fault Pulse, generated by the Fault Detection Circuit 18, in the Remote Unit 14 transfers the Parallel to serial shift registers 117, 118 to the serial mode and thereby freezes the count that is present at the start of the Fault Pulse. The 100 ms Fault Pulse also goes to JK Flipflop 120 which delays output until after one modulator clock pulse. After the output of JK Flipflop 120 is "high", gate 121 is enabled. This allows modulator clock pulses to shift fault data through the parallel/serial shift registers 117 and 118. The function of the JK Flipflop 120 and gate 121 is to synchronize the data clocking with the modulator clock signals received at 122 from Remote Unit Modulator 16 Signal 31. JK Flipflop 120 is reset at the end of the 100 ms Fault Pulse. Its output "0" goes to gate 124 and causes a continuous "0" data to be sent to the Master Unit 13. The end of the 100 ms Fault pulse sets JK Flipflop 123. When data is transferred by the Remote Unit 14 it goes from the Parallel/serial registers 117, 118 through JK Flipflop 123 through gate 124 to the Modulator. JK Flipflop 123 adds a "1" bit in front of the data which is used in the Master Unit 13 as a "data complete" indication. Since the serial input to the Parallel/serial register 117 is kept low ("0") the only "1" data transmitted other than data is the leading "1" when the Remote Unit 14 has been triggered by a Fault.

The remote counters 111-114 are synchronized to the Master Unit 13 by the Demodulator Reset pulses on line 125 which occur 926 times per second and directly reset counters 111, 112 and 113. One of every ten reset pulses is preceded by "1" data from the Master Unit 13 as an indicating time signal to reset counter 114 (count 1000's).

Note that the Remote counter is synchronized to the master counter, but will not have an identical count because of delays in the communication network. This is no problem as long as the delay is constant since provision is made to measure the delay and for the Microprocessor 15 to apply a correction when calculating Fault distance.

The foregoing description of the preferred embodiments of the invention has been presented for purposes of illustration and description. It is not intended to be exhaustive or to limit the invention to the precise form disclosed, and obviously many modifications and variations are possible in light of the above teaching. The embodiments discussed in detail were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. An electronic fault finder for identifying the location of a fault occurring along an electrical power transmission line coupled to a master unit and a geographically separated remote unit, comprising:

fault detection circuit means at both the master unit and remote unit for distinguishing between background line noise and an incoming fault pulse, and for producing a logic fault signal at each unit in response to a detected fault pulse;

master unit and remote unit clock means for providing constantly changing numerical output signals at the master unit and remote unit, respectively, the numerical output signals being representative of distance along the line;

means operatively connected to the master unit clock means for modulating and transmitting clock signals over a communications line from the master unit clock means to the remote unit;

means at the remote unit for demodulating clock signals received from the master unit and for synchronizing operation of the remote unit clock means to operation of the master unit clock means;

master unit data means operatively connnected to the master unit fault detection circuit means and clock means for producing a binary output signal in response to a logic fault signal produced by the master unit fault detection circuit means, the binary output signal being representative of distance along the line from the master unit to the location of the fault;

remote unit data means operatively connected to the remote unit fault detection circuit means and clock means for producing a binary output signal in response to a logic fault signal produced by the remote unit fault detection circuit means, the binary output signal being representative of distance along the line from the remote unit to the location of the fault;

means operatively connected to the remote unit data means for modulating the binary output signals produced by it and transmitting the modulated signals to the master unit over the communications line;

means for demodulating signals received by the master unit; and microprocessor means at the master unit for processing both the binary output signals produced by the master unit data means and the binary output signals transmitted from the remote unit data means to produce a distance output value representative of the location of a fault along the line.

2. The fault finder of claim 1 further including:

filter means in the fault detection circuit means at both the master unit and remote unit for selectively filtering out normal expected background frequencies in the line.

3. The fault finder of claim 2 wherein each filter means comprises a variable wide-range filter.

4. A method for identifying the location of a fault occurring along an electrical power transmission line coupled to a master unit and a geographically separated remote unit, comprising the following steps:

monitoring all wave forms other than line frequency at both the master unit location and at the remote unit location;

discriminating between fault surges and repetitive background line noise levels at each unit;

developing a logic fault signal at each unit in response to a detected fault pulse;

synchronizing a remote unit clocking system with operation of a similar master unit clocking system by modulating signals produced by the master unit clocking system and transmitting the modulated signals over a conventional communication line for demodulation at the remote unit;

producing a binary output signal at the master unit in response to a logic fault signal, the binary output signal being representative of distance along the line from the master unit to the location of the fault;

producing a binary output signal at the remote unit in response to a logic fault signal, the binary output signal being representative of distance along the line from the remote unit to the location of a fault;

transmitting a modulated binary output signal from the remote unit to the master unit over the communication line for demodulation and storage at the master unit;

and electronically processing the binary output signals to produce a distance output value representative of the location of the fault along the line.

5. The method of claim 4 wherein the step of discriminating between a fault surge and repetitive background line noise levels is accomplished by the following steps:

continuously monitoring peak background noise level of the line at each station;

and detecting a fault as it occurs by comparing each fault pulse and the monitored peak background noise level.

6. The method of claim 5 wherein the step of monitoring the peak background noise level is preceded by filtering of the normal expected background frequencies.

7. The method of claim 4 further including the step of operating an audible or visible alarm upon production of each logic fault signal.

* * * * *